(12) United States Patent
Goldbach et al.

(10) Patent No.: US 7,718,475 B2
(45) Date of Patent: May 18, 2010

(54) METHOD FOR MANUFACTURING AN INTEGRATED CIRCUIT INCLUDING A TRANSISTOR

(75) Inventors: Matthias Goldbach, Dresden (DE); Erhard Landgraf, Dresden (DE); Michael Stadtmueller, Dresden (DE); Moritz Haupt, Dresden (DE); Sven Schmidbauer, Dresden (DE); Tobias Mono, Dresden (DE); Jorg Radecker, Dresden (DE)

(73) Assignee: Qimonda AG, Munich (DE)

( * ) Notice: Subject to any disclaimer, the term of this patent is extended or adjusted under 35 U.S.C. 154(b) by 314 days.

(21) Appl. No.: 11/786,822

(22) Filed: Apr. 13, 2007

(65) Prior Publication Data

US 2008/0251815 A1 Oct. 16, 2008

(51) Int. Cl.
*H01L 21/335* (2006.01)
*H01L 29/76* (2006.01)

(52) U.S. Cl. ...................................... 438/142; 257/213
(58) Field of Classification Search .................. 438/198, 438/142, 238; 257/255, 213, 296, E21.458
See application file for complete search history.

(56) References Cited

U.S. PATENT DOCUMENTS

| 2004/0023503 | A1* | 2/2004 | Pan et al. ..................... 438/706 |
| 2005/0199958 | A1* | 9/2005 | Chen et al. ................... 257/368 |
| 2006/0145264 | A1* | 7/2006 | Chidambarrao et al. ..... 257/369 |
| 2007/0040225 | A1* | 2/2007 | Yang ........................... 257/369 |
| 2007/0045631 | A1* | 3/2007 | Endo et al. ..................... 257/77 |
| 2007/0152259 | A1* | 7/2007 | Zheng ......................... 257/309 |
| 2008/0157264 | A1* | 7/2008 | Zhao et al. .................. 257/510 |

* cited by examiner

*Primary Examiner*—Calvin Lee
(74) *Attorney, Agent, or Firm*—Fay Kaplun & Marcin, LLP

(57) ABSTRACT

The present invention relates to a transistor comprising a gate channel area and a gate stack having mechanical stress arranged on the gate channel area.

24 Claims, 3 Drawing Sheets

METHOD FOR MANUFACTURING AN INTEGRATED CIRCUIT INCLUDING A TRANSISTOR

BACKGROUND OF THE INVENTION

1. Field of the Invention

The present invention relates to a method for manufacturing a transistor. Further, the invention relates to a transistor and a memory device comprising such a transistor.

2. Description of the Related Art

Although in principle applicable to any structured semiconductor device, the following invention is explained for transistors of a DRAM.

A DRAM device comprises a plurality of transistors for controlling access to data stored. The delay time for reading and writing depends on the resistivity of gate channels of the transistors. Methods for enhancing the mobility of major carriers in the gate channel is therefore, subject of investigation.

BRIEF SUMMARY OF THE INVENTION

According to a first aspect of the invention a transistor comprises a gate channel area and a gate stack having mechanical stress arranged on the gate channel area.

A transistor comprises a gate channel area, and a gate stack formed on the gate channel area, the gate stack applying a mechanical force to the gate channel area.

According to a second aspect of the invention a memory device comprises a plurality of transistors according to the first aspect of the invention.

According to a third aspect of the invention a method for manufacturing comprises the steps of:

providing a substrate;

forming at least one gate channel area in the substrate;

depositing a gate stack above the at least one gate channel area, the gate stack having mechanical stress to apply a mechanical force to the gate channel area.

According to a forth aspect of the invention a method for manufacturing comprises the steps of:

providing a substrate;

forming at least one gate channel area in the substrate, depositing a gate stack on the at least one gate channel area comprising the steps:

depositing a conductive layer; and implanting the dopant into the conductive layer.

According to a fifth aspect of the invention a method for manufacturing comprises the steps of:

providing a substrate;

forming at least one gate channel area in the substrate, depositing a gate stack on the at least one gate channel area comprising the steps:

forming a layer of amorphous silicon;

depositing an intermediate layer on the layer of amorphous silicon, the intermediate layer having a mechanical stress for applying a stress loading to the layer of amorphous silicon;

transforming the amorphous silicon to polycrystalline silicon; and removing the intermediate layer from the polycrystalline silicon.

DETAILED DESCRIPTION OF THE INVENTION

Figure 1:
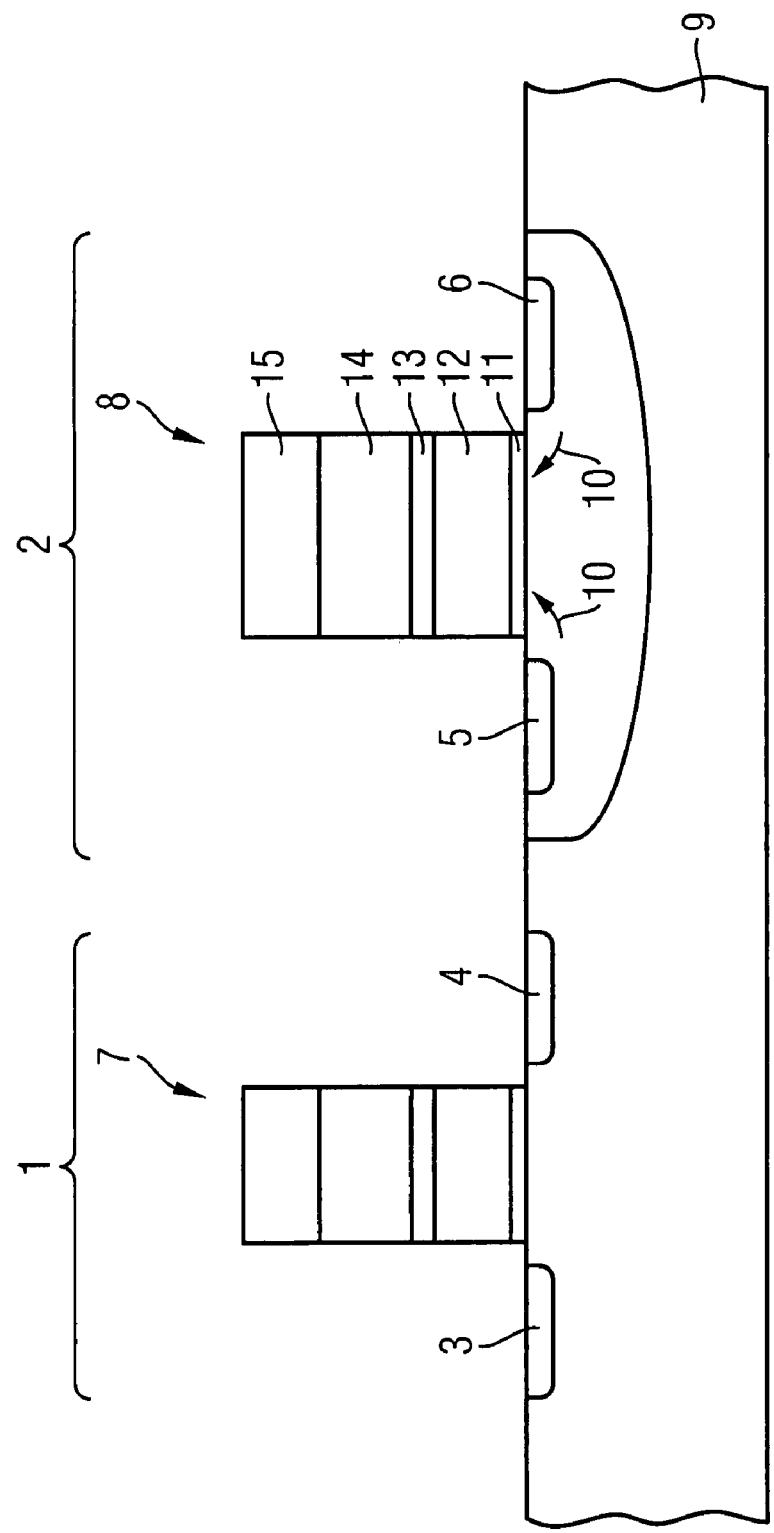
FIG. 1 illustrates two transistors according to a first embodiment of the invention.
Figure 2:
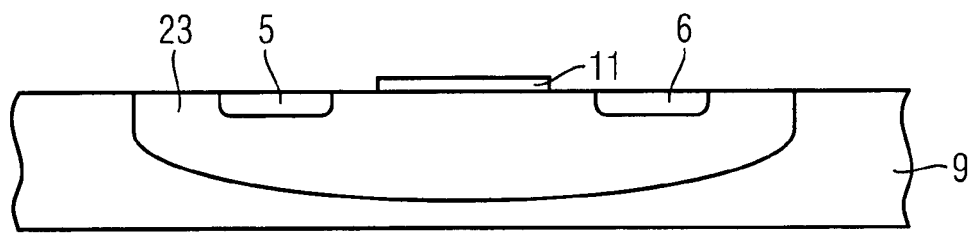
FIGS. 2 to 7 illustrate steps for forming a gate stack according to a further embodiment.

A first embodiment of the present invention is illustrated along with the cross section of two transistors 1, 2 shown in FIG. 1. Both transistors can be implemented in the support area or logical area of a memory device. The first transistor 1 and the second transistor 2 are of opposite conductivity type. For instance, the first transistor 1 may be a p-type transistor and the second transistor 2 an n-type transistor. The n-type transistor 1 comprises an n-doped source area 3 and an n-doped drain area 4. The p-type transistor 2 comprises p-doped source and drain area 5, 6. Gate stacks 7, 8 of the transistors 1, 2 may be formed equally.

In the following a description is given how to manufacture the gate stacks 7, 8. The formation will be explained along with gate stack 8 of the second, n-type transistor 2. The same steps can be applied simultaneously to form the gate stack 7 of first transistor 1 if not mentioned otherwise. In other embodiments, the two gate stacks 7, 8 can be formed independently, in even further embodiments just one of the two gate stacks 7, 8 is formed because just one type of transistors is used, for instance in the memory area of a memory device.

A gate stack 8 is formed such that the gate 8 is subdued to a compressive stress. A compressive stress is the stress applied to the gate stack 8 resulting in its compaction. The compressive stress becomes effective when the transistor is in operation, i.e. at operating temperatures in the range specified for the device. For instance, in the range of −40° C. to 90° C.

There is a balance of the forces in the transistor 2. Therefore, the area below the gate stack, i.e. the gate channel area, is subdued to a tensile stress. A tensile stress is the stress state leading to expansion, i.e., the length of a material tends to increase in the tensile direction. The tensile stress generates a force directed from the gate channel of transistor 2 towards the gate stack 8 along the direction 10, as illustrated in FIG. 1.

The mobility of carriers in the gate channel is effected by the tensile stress. The tensile stress may increase the mobility in the n-type gate channel of the transistor 2. A compressive stress applied to the gate channel of the n-type transistor 2 may decrease the mobility of the carriers. A p-type transistor, e.g. transistor 1, may behave different to the n-type transistor 2. A compressive stress in a p-type gate channel may increase the mobility and a tensile stress may decrease the mobility of the carriers. Additionally, this may depend on the orientation of the gate channel along the crystallographic directions of the substrate 9. A gate channel of a p-type transistor orientated along the <100> orientation may almost be not influenced by tensile stress in the gate channel area. The mobility of carriers in a n-type gate channel may be enhanced by tensile stress, even if the gate channel is orientated along the direction <100>.

The above embodiment refers to transistors having their gate channels orientated along the <100> direction.

In the following, the deposition of the gate stack 7, 8 having compressive stress is illustrated.

A gate stack may comprise several layers, for instance, a gate dielectric 11, a polysilicon layer 12, a diffusion barrier layer 13, a metallic layer 14, a cap layer 15. The gate dielectric layer 11 may be formed as nitrided silicon oxide, silicon oxide or any other suitable dielectric material. The thickness of the gate dielectric layer 11 is typically in the range of 0.5-10 nm. The polysilicon layer 12 is arranged above or in contact to the gate dielectric 11. An n-type or p-type dopant may be introduced into the polysilicon, for instance by ion implantation. The thickness of the polysilicon layer is typically in the range of 5-300 nm, in particular 60 nm. A barrier layer made of titanium or titanium nitride may be deposited on the polysilicon layer 11. The thickness of the diffusion barrier 13 is usually very thin, in the range of a few nm. The conductive layer 14 may be of any high conductive material, in particular tungsten, tungsten nitride. The thickness may be in the range of 3-100 nm, typically 40 nm. The top portion of the gate stack 8 is formed by a cap layer, typically of silicon nitride having a thickness of 10-500 nm.

The deposited polysilicon is under compressive stress. Instead of polysilicon, polycrystalline silicon germanium can be used.

Polycrystalline silicon or polycrystalline silicon germanium can be deposited in a low-pressure chemical wafer deposition technique. A typical pressure in the reaction chamber is in the range of 8-200 Pascal. The deposition takes place at an elevated temperature, for instance above 600° C., in particular in the range between 600° C. and 640° C. The elevated temperature leads to a re-crystallization of deposited silicon to the polycrystalline silicon for polycrystalline silicon germanium. The reaction chamber is a batch reactor or processing a plurality of wafers at the same time.

Polycrystalline silicon or polycrystalline silicon germanium can be deposited in a single wafer reactor by a chemical wafer deposition technique at a high deposition temperature, for instance above 600° C., in particular 640°-690° C. and at atmospheric pressure.

The reactant gases can comprise at least one of silan ($SiH_4$) and germanium hydride ($GeH_4$). Additional purging gases may be introduced into the reaction chamber.

In a further embodiment, a very thin layer of amorphous silicon is deposited below the polycrystalline silicon layer 12. The processing conditions are at a lower temperature, for instance below 600° C., in particular 500°-590° C. The deposition can be effected by a low pressure chemical wafer deposition in a batch reactor. The deposition of the polycrystalline silicon or the polycrystalline silicon germanium is performed as outlined herein above.

Another embodiment generates the compressive stress in the gate stack in the conductive layer 14. This embodiment may be combined with the embodiment disclosed herein above. After depositing the polycrystalline silicon, silicon germanium or an amorphous silicon, the reaction chamber is degassed. The chamber is evacuated and water vapor is removed from the wafers, for instance by heating the wafers to a temperature in the range of 300-400° C. Subsequently, the wafers or substrates 9 are actively cooled to a temperature below 100° C. or in the range of 0-100° C. The conductive layer 14 is deposited on this cooled substrate 9. The deposition may be performed by a sputtering process or a chemical vapor deposition.

Additionally, a doped material may be implanted into the conductive layer 14. This implantation takes place after the conductive layer 14 is deposited.

The conductive layer 14 may be made of tungsten or tungsten nitride. Suitable dopant material may be germanium or argon.

Instead of cooling down the substrate to a temperature below a 100° C. an implantation of the dopant material can be effected, only.

Further embodiment establishes the compressive stress in the cap layer 15. The cap layer is deposited by a high density plasma chemical wafer deposition (HDP-CVD). The wafer is introduced into a reaction chamber. The plasma in this reaction chamber is inductively coupled. The deposition temperature may be in the range of 300-500° C., for instance. The applied radio frequency power is in the range of a 100 W to 10 kW. The pressure reaction chamber can be typically in the range of 0,1-10 Pa. Reaction gases which may be used for instance are silan, nitrogen, argon and hydrogen. Thus, a cap layer made of silicon nitride is deposited.

In an alternative, a parallel plate reactor is used to deposit the compressed cap layer. The radio frequency power applied is in the range between 100 W and 1 kW. The pressure in the reaction chamber is in the range of 150-1000 Pa. A cap layer made of silicon nitride can be deposited by silan, ammonia, nitrogen and argon as reactant gases.

A further embodiment is illustrated along with FIGS. 2-7. A silicon substrate 9 is provided alike in the former embodiments. In the chosen illustration (FIG. 2) a doped well 23 is formed into the substrate 9. In other embodiments, there may be formed no doped well 23. A drain area 5 and a source area 6 are provided in the doped well 23 or in the substrate 9. The source area 6 and the drain area 5 may be formed before or after the formation of the gate stack.

A gate dielectric 11 is formed on the substrate 9. The dielectric layer 11 may be formed of silicon oxide, silicon nitride, nitrided silicon oxide or any other suitable dielectric material.

Figure 3:
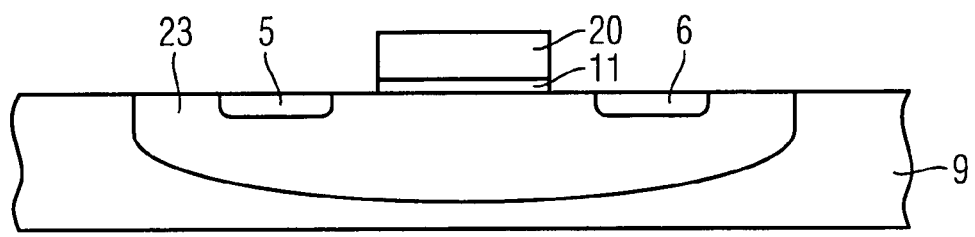

In a next step, a layer of amorphous silicon 20 is formed on the dielectric layer 11. The layer of amorphous silicon may be directly deposited in an amorphous state. In another embodiment, the polysilicon layer is deposited and transformed into an amorphous state by ion bombardment. Other suitable ways of transforming the polysilicon into amorphous silicon can be used as well (FIG. 3).

Figure 4:
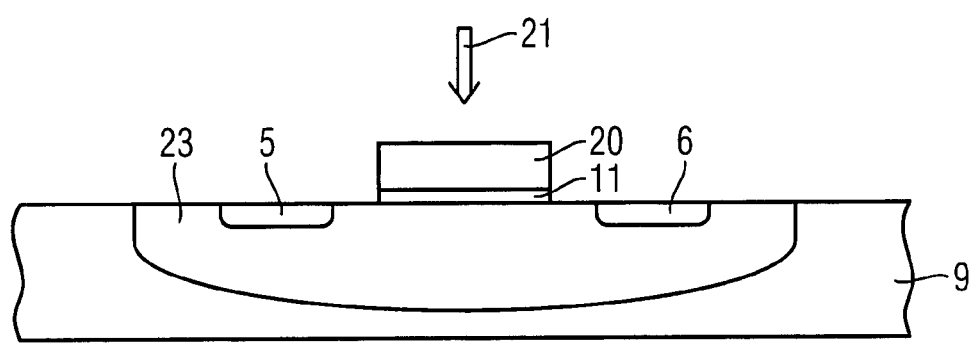

Optionally, a dopant 21 is implanted into the layer of amorphous silicon 20. The dopant can be for example arsen. The concentration of the dopant is in the range of $10^{-17}$-$10^{-19}$ $cm^{-3}$ (FIG. 4).

Figure 5:
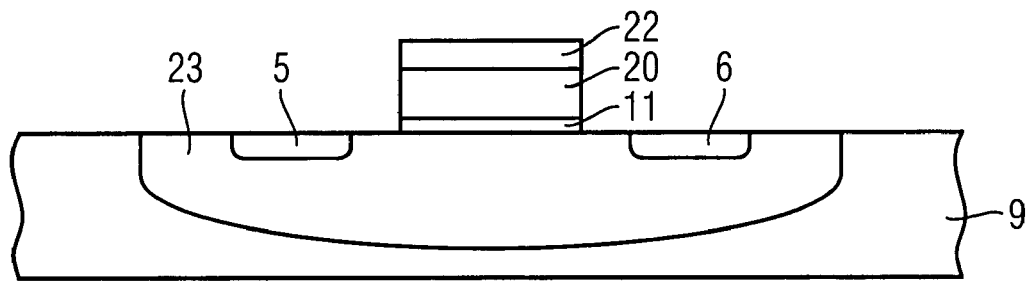

An intermediate layer 22 is deposited onto the layer of amorphous silicon 20 (FIG. 5). The intermediate layer may be of silicon oxide or silicon nitride. The intermediate layer 22 is deposited such that it provides a mechanical stress to the layer of amorphous silicon 20. The intermediate layer 22 can be under tensile stress.

Figure 6:
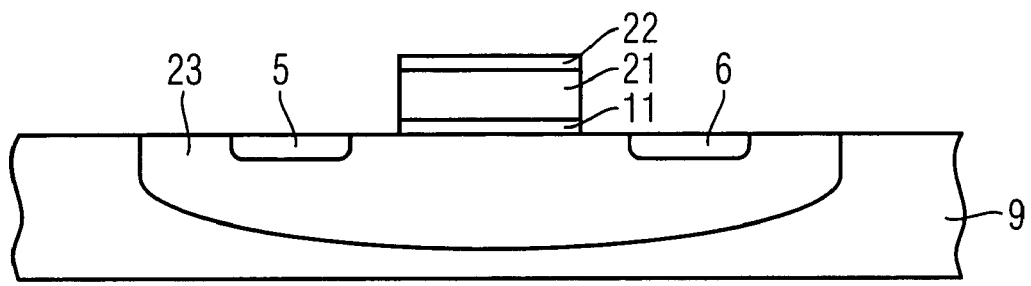
Figure 7:
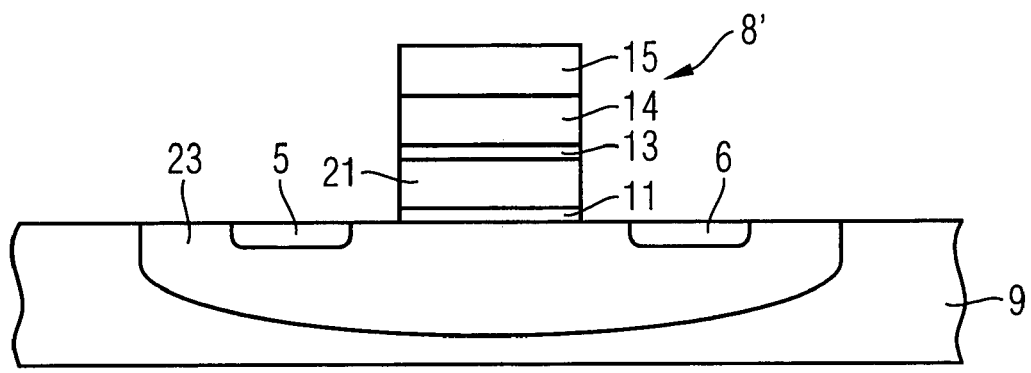

Subsequently, a high temperature annealing step is applied to the layer of amorphous silicon 20. During the high temperature annealing step, the amorphous silicon transforms into a polycrystalline state. Thus, the layer of amorphous silicon 20 changes to a layer of polycrystalline silicon 21 (FIG. 6).

The intermediate layer 22 is removed. The following steps for manufacturing a complete gate stack 8' can be performed according to one of the above embodiments. This includes the formation of an optional diffusion barrier layer 13, a metallic layer 14 and a final cap layer 15.

The above embodiments can be combined in multiple ways. There is no restriction to such a single embodiment.

In particular the embodiments can be combined to provide a polycrystalline layer under compressive stress, a conductive layer under compressive stress, and a cap layer under compressive stress.

What is claimed is:

1. A method for forming an integrated circuit including a transistor comprising:

forming a gate stack over a gate channel area disposed in a semiconductor substrate, the gate stack having a first mechanical stress to apply a first mechanical force to the gate channel area, the gate channel having a balancing second mechanical stress to apply a balancing second mechanical force to the gate stack.

2. The method according to claim 1, wherein the gate channel area is formed as an n-type gate channel and the gate stack is formed so as to have a compressive stress to apply a tensile loading to the n-type gate channel area.

3. The method according to claim 2, wherein forming the gate stack comprises depositing of at least one of poly-crystalline silicon and polycrystalline silicon germanium over the gate channel area.

4. The method according to claim 3, wherein the at least one of polycrystalline silicon and polycrystalline silicon germanium is deposited using a low-pressure chemical vapour deposition technique.

5. The method according to claim 3, wherein the at least one of polycrystalline silicon and polycrystalline silicon germanium is deposited at a temperature in the range of approximately 600° C. to 640° C.

6. The method according to claim 5, wherein the at least one of polycrystalline silicon and polycrystalline silicon germanium is deposited at a pressure in a range of approximately 10 Pa to approximately 200 Pa.

7. The method according to claim 3, further comprising forming an amorphous silicon layer before forming the at least one of polycrystalline silicon and polycrystalline silicon germanium.

8. The method according to claim 2, wherein forming a gate stack comprises forming a cap layer using a high-density plasma chemical vapour deposition technique.

9. The method according to claim 8, wherein the high-density plasma is generated by an inductive coupling and the radio-frequency power is in the range of approximately 100 W to 10 kW.

10. The method according to claim 2, wherein forming the gate stack comprises cooling the substrate to a temperature below approximately 100° C. and forming at least one of a diffusion barrier, a conductive layer, and a cap layer over the gate channel area at a temperature below approximately 100° C.

11. The method according to claim 10, further comprising implanting a dopant into the conductive layer after forming the cap layer over the conductive layer.

12. The method according to claim 11, wherein the dopant comprises at least one of germanium and argon.

13. The method according to claim 10, wherein the diffusion barrier comprises at least one of titanium and titanium nitride.

14. The method according to claim 10, wherein the conductive layer comprises at least one of tungsten and tungsten nitride.

15. The method according to claim 10, wherein the cap layer comprises silicon nitride.

16. The method according to claim 1, wherein the gate channel area is orientated along the <100> direction of the substrate.

17. A method for forming an integrated circuit including a transistor comprising:
providing a substrate;
forming at least one gate channel area in the substrate,
forming a gate stack over a gate channel area disposed in a semiconductor substrate, wherein forming the gate stack comprises,
forming a layer of amorphous silicon;
forming an intermediate layer over the layer of amorphous silicon, the
intermediate layer having a first mechanical stress for applying a first stress loading to the layer of amorphous silicon mechanical force to the gate channel area, the gate channel area having a balancing second mechanical stress to apply a balancing second mechanical force to the intermediate layer;
transforming the layer of amorphous silicon to a layer of polycrystalline silicon; and
removing the intermediate layer from the layer of polycrystalline silicon.

18. The method according to claim 17, wherein the intermediate layer is formed using a high density plasma chemical vapor deposition technique.

19. The method according to claim 17, wherein the intermediate layer is made of silicon nitride or silicon oxide.

20. The method according to claim 17, wherein the intermediate layer has a tensile stress for applying a tensile loading to the amorphous layer.

21. The method according to claim 17, wherein a high temperature annealing process is applied to the intermediate layer and the layer of amorphous silicon for transforming the layer of amorphous silicon to the layer of polycrystalline silicon.

22. The method according to claim 17, wherein a dopant is implanted into the layer of amorphous silicon.

23. The method according to claim 17, wherein the at least one gate channel area is formed orientated along the <100> direction of the substrate.

24. The method of claim 17, wherein the intermediate layer is formed on the layer of amorphous silicon.

* * * * *